US007268200B2

(12) United States Patent
Townsend, III et al.

(10) Patent No.: US 7,268,200 B2
(45) Date of Patent: Sep. 11, 2007

(54) ORGANOSILICATE RESINS AS HARDMASKS FOR ORGANIC POLYMER DIELECTRICS IN FABRICATION OF MICROELECTRONIC DEVICES

(75) Inventors: Paul H. Townsend, III, Midland, MI (US); Lynne K. Mills, Midland, MI (US); Sheila Gombar-Fetner, Midland, MI (US)

(73) Assignee: Dow Global Technologies Inc., Midland, MI (US)

( * ) Notice: Subject to any disclaimer, the term of this patent is extended or adjusted under 35 U.S.C. 154(b) by 0 days.

(21) Appl. No.: 11/262,237

(22) Filed: Oct. 28, 2005

(65) Prior Publication Data

US 2006/0063393 A1   Mar. 23, 2006

Related U.S. Application Data

(62) Division of application No. 09/933,535, filed on Aug. 20, 2001, now Pat. No. 7,115,531.

(60) Provisional application No. 60/284,317, filed on Apr. 17, 2001, provisional application No. 60/226,170, filed on Aug. 21, 2000.

(51) Int. Cl.
*C08G 77/08* (2006.01)

(52) U.S. Cl. .................. 528/32; 106/287.15; 556/450; 528/43

(58) Field of Classification Search .................. None
See application file for complete search history.

(56) References Cited

U.S. PATENT DOCUMENTS

| | | | |
|---|---|---|---|
| 3,457,224 A | 7/1969 | Thomas | |
| 3,474,070 A | 10/1969 | Levene | |
| 3,491,054 A | 1/1970 | Thomas | |
| 3,837,897 A | 9/1974 | Marzocchi | |
| 4,043,953 A | 8/1977 | Chang et al. | |
| 4,596,733 A | 6/1986 | Cohen et al. | |
| 4,812,588 A | 3/1989 | Schrock | |
| 5,115,082 A | 5/1992 | Mercer et al. | |
| 5,136,069 A | 8/1992 | DeVries et al. | |
| 5,138,081 A | 8/1992 | DeVries et al. | |
| 5,155,175 A | 10/1992 | Mercer et al. | |
| 5,179,185 A * | 1/1993 | Yamamoto et al. | 528/32 |
| 5,179,188 A | 1/1993 | Mercer et al. | |
| 5,874,516 A | 2/1999 | Burgoyne, Jr. et al. | |
| 5,965,679 A | 10/1999 | Godschalx et al. | |
| 5,989,998 A | 11/1999 | Sugahara et al. | |
| 5,994,489 A | 11/1999 | Harris et al. | |
| 6,143,855 A | 11/2000 | Hacker et al. | |
| 6,218,078 B1 | 4/2001 | Iacoponi | |
| 6,218,317 B1 | 4/2001 | Allada et al. | |
| 6,231,989 B1 | 5/2001 | Chung et al. | |
| 6,232,424 B1 | 5/2001 | Zhong et al. | |
| 6,265,780 B1 | 7/2001 | Yew et al. | |
| 6,358,559 B1 | 3/2002 | Hacker et al. | |
| 6,359,099 B1 | 3/2002 | Hacker et al. | |
| 6,361,820 B1 | 3/2002 | Hacker et al. | |
| 6,399,733 B1 * | 6/2002 | Yamamoto et al. | 528/12 |
| 6,451,382 B2 * | 9/2002 | Schutt et al. | 427/387 |
| 6,576,393 B1 | 6/2003 | Sugita et al. | |
| 6,787,625 B2 * | 9/2004 | Lee | 528/33 |

FOREIGN PATENT DOCUMENTS

| | | |
|---|---|---|
| DE | 4 218 495 A | 12/1992 |
| EP | 0 466 025 | 7/1991 |
| EP | 0 875 928 A2 | 11/1998 |
| EP | 0 755 957 B1 | 5/1999 |
| EP | 1 028 460 A2 | 8/2000 |
| EP | 1 182 275 A2 | 2/2002 |
| JP | 3132885 B2 | 10/2003 |
| TW | 40435 | 9/2000 |
| WO | WO91/09081 | 6/1991 |
| WO | WO94/25903 | 11/1994 |
| WO | WO97/01593 | 1/1997 |
| WO | WO97/10193 | 3/1997 |
| WO | WO 00/11096 | 3/2000 |
| WO | WO 00/18847 A | 4/2000 |
| WO | WO 00/31183 | 6/2000 |
| WO | WO 00/75979 | 12/2000 |
| WO | WO 01/18861 A1 | 3/2001 |

OTHER PUBLICATIONS

Materials Research Society (MRS) Bulletin, Oct. 1997, vol. 22, No. 10.
Hendricks et al., Polym. Prepr., Am. Chem. Soc., Div. Polym. Chm., vol. 37(1), pp. 150-151 (1996).
Drage et al., Material Res. Soc., Symp. Proc., "Low Dielectric Constant Materials III," vol. 476, pp. 121-128 (1997).
Baney et al., "Silesquioxanes," *Chem. Rev.*, vol. 95, pp. 1409-1430 (1995).
Brown et al., "Double Chain Polymers of Phenysilsesquioxane," *J. Am. Chem. Soc.*, vol. 82, pp. 6194-6195 (1960).
Suminoe et al., "Soluble siloxanes from methyltrichlorosilane," *Chemical Abstracts*, vol. 89:180824; No. 22, pp. 33 (1978).
Wagner et al., "Reactions of Vinyltrichlorosilane and Vinyltrethoxysilane," *Industrial and Engineering Chemistry*, vol. 45, No. 2, pp. 367-374 (1953).
Yamazaki et al., "Soluble Ladder Type of Ply9silsesquioxanes) Having Functional Groups," *Contemp. Polym. Sci.*, vol. 4, pp. 105-113 (1984).
Weidman et al., "New photdefinable glass etch masks for entirely dry photolithography: Plasma deposited organosilicon hydride polymers", *Appl. Phys. Lett.*, vol. 62, No. 4, pp. 372-374 (1993).
Maisonobe et al., "SILK compatibility with the IMD process using copper metallization," *Microelectronics Engineering*, vol. 50, pp. 25-32 (2000).

* cited by examiner

*Primary Examiner*—Margaret G. Moore (57) ABSTRACT

This invention is directed to a method of making a composition in which a silane having an unsaturated group and a silane having an aromatic group are hydrolyzed. In this method the more highly reactive silane is continuously added during the hydrolysis reaction of the less reactive silane. The composition can be used in the fabrication of microelectronic devices, particularly as hardmasks or etch-stops.

6 Claims, 2 Drawing Sheets

Fig. 1

Fig. 2

ORGANOSILICATE RESINS AS HARDMASKS FOR ORGANIC POLYMER DIELECTRICS IN FABRICATION OF MICROELECTRONIC DEVICES

CROSS-REFERENCE TO RELATED APPLICATION

This application is a divisional of application Ser. No. 09/933,535 filed Aug. 20, 2001 now U.S. Pat. No. 7,115,531 which claims priority to U.S. provisional applications Ser. No. 60/226,170 filed Aug. 21, 2000 and No. 60/284,317 filed Apr. 17, 2001.

FIELD OF THE INVENTION

This invention relates to the fabrication of microelectronic devices having organic polymeric dielectric materials and, more specifically, to the use of organosilicate resins as hardmasks (or etchstops) in the fabrication of such devices.

BACKGROUND OF THE INVENTION

The microelectronics fabrication industry is moving toward smaller geometries in its devices to enable lower power consumption and faster device speeds. As the conductor lines become finer and more closely packed, the requirements of the dielectrics between such conductors become more stringent. New materials having a lower dielectric constant than the dielectric constant for silicon dioxide, the traditionally used dielectric material, are being investigated. Among the dielectric materials that are attaining increased acceptance are spin-on, organic polymers having a dielectric constant of less than about 3.0. Polyarylenes, including polyarylene ethers and SiLK™ semiconductor dielectric (from The Dow Chemical Company), are the primary organic polymeric dielectrics being considered.

The fabrication of microelectronic devices using these new dielectric materials is being reviewed. See, e.g., "Material Research Society (MRS) Bulletin, Oct. 1997, Volume 22, Number 10" To date, however, the polyarylene dielectrics generally have been patterned in the traditional manner using inorganic hardmasks in forming patterns in the dielectric materials. Typically, the polyarylene dielectric is applied to the substrate and cured, followed by vapor deposition of an inorganic hardmask. A pattern is formed in the inorganic hardmask according to standard patterning practices, e.g., application of a photoresist (i.e., softmask), followed by exposure and development of the softmask, pattern transfer from the softmask into the hardmask, and removal of the softmask. Etching of the hardmask is typically done using fluorine based chemistries. The underlying polyarylene dielectric can then be patterned. Deposition conditions must be carefully monitored to assure adequate adhesion between the hardmask and the polyarylene films.

Subsequent to the original priority date claimed by this application, patent publications were made that also discuss various methods and embodiments of dielectric materials, etch stops and hardmasks in fabrication of microelectronic devices.

In WO01/18861 (15 Mar. 2001), after stating the well known concept that layers used as adjacent etchstop and dielectric materials should have substantially different etch selectivities, the applicants teach that an inorganic layer (defined as containing no carbon atoms) should be used as a via level and metal level intermetal dielectric and an organic low dielectric constant material should be used between the inorganic layers as an etch stop material.

In WO00/75979 (14 Dec. 2000), teaches a structure having a first dielectric layer which is an organic polymer and a second dielectric layer over the first layer which is a organohydridosiloxane made by a relatively complex synthesis method.

In addition, U.S. Pat. No. 6,218,078 (Apr. 17, 2001 filed Sep. 24, 1997) teaches the use of a spin on hardmask (only hydrogensilsesquioxane is mentioned) over a low dielectric constant polymer (only benzocyclobutene is mentioned).

Finally, U.S. Pat. No. 6,218,317 (Apr. 17, 2001 filed Apr. 19, 1999) teaches use of methylated oxide hardmasks over polymeric interlayer dielectric materials. This patent mentions the benefits that both hardmask and ILD can be spin-coated.

SUMMARY OF THE INVENTION

The Inventors have discovered an improved method that would reduce the need for vapor deposition of inorganic hardmasks. Depending on the specific integration scheme used, this reduction or elimination could reduce costs and improve performance and yield due to elimination of the need to take the wafer off the spin track for vapor deposition of the hardmask, potentially lower effective dielectric constant in the device when the hardmask is an embedded hardmask (or etchstop) due to the lower dielectric constants of the organosilicates compared to standard inorganic hardmasks, and potential additional process improvements when the hardmask is photodefinable.

Thus, according to a first embodiment this invention is a method comprising providing a substrate, forming a first layer on the substrate, wherein the first layer has a dielectric constant of less than 3.0 and comprises an organic polymer, applying an organosilicate resin over the first layer, removing a portion of the organosilicate resin to expose a portion of the first layer, and removing the exposed portions of the first layer. Preferably, the organosilicate resin is selected from oligomers and polymers based on a divinyl siloxane bis benzocyclobutene type monomer or from hydrolyzed alkoxy or acyloxysilanes.

Optionally, the organosilicate resin can be removed after imaging of the first layer. According to a second option a second layer of a low dielectric constant organic polymer is applied over the organosilicate layer. In this configuration, the organosilicate functions as a buried etch stop to control precisely the depth of trench in a dual damascene integration scheme. The buried etch stop may have areas removed by lithography where vias will penetrate into the first organic polymer dielectric layer. The etching of the buried etchstop layer may occur before or after coating of the second organic polymer layer depending upon what type of integration scheme is selected.

The invention is also an integrated circuit article comprising an active substrate containing transistors and an electrical interconnect structure containing a pattern of metal lines separated, at least partially, by layers or regions having a dielectric constant of less than 3.0 and comprising an organic polymer, wherein the article further comprises a layer of an organosilicate resin above at least one layer of the organic polymer material.

Moreover, the Inventors have discovered that not all organosilicates are equally compatible with the various organic polymer dielectrics used as the interlayer dielectrics.

Particularly, for use with low dielectric organic arene polymers based on Diels Alder chemistry or that may otherwise have ethylenic unsaturation, the following formulation is very useful as either a hardmask, etchstop, or, even adhesion promoting layer. Thus, according to a third embodiment this invention is a composition comprising hydrolyzed or partially hydrolyzed reaction products of:

(a) an alkoxy or acyloxy silane having at least one group containing ethylenic unsaturation which group is bonded to the silicon atom (b) an alkoxy or acyloxy silane having at least one group containing an aromatic ring which group is bonded to the silicon atom, and (c) optionally an alkoxy or acyloxy silane having at least one group which is a $C_1$-$C_6$ alkyl, which is bonded to the silicon atom.

According to a fourth embodiment this invention is an article comprising two layers in direct contact with each other the first layer being an arene polymer having ethylenic unsaturation and the second layer being the composition according to the third embodiment or the cured product of such a composition.

DETAILED DESCRIPTION OF THE INVENTION

The first layer is a material having a low dielectric constant and is formed primarily from an organic polymer, which makes up at least the majority of the first layer. As used herein, "organic polymer" means a polymer, which has primarily carbon in its backbone of the polymer chain, but may also include heteroatoms, such as oxygen (e.g., polyarylene ethers) or nitrogen (see, e.g., polyimides as described in *Thin Film Multichip Modules*, pp. 104-122, International Society for Hybrid Microelectronics, 1992). The organic polymer may contain small amounts of Si in the backbone but are, more preferably, free or essentially free of Si in the backbone. The first layer may contain pores. These pores may be helpful in further reducing the dielectric constant of the material. The layer may also contain adhesion promoters (including Si containing adhesion promoters), coating aids, and/or residual materials left after forming the pores. The amount of such additional components found in the first layer is preferably relatively small amounts, e.g., less than 10 percent by weight, preferably less than 1 percent by weight, most preferably less than 0.1 percent by weight.

Preferably, the first layer is either a porous or non-porous polyarylene. Examples of polyarylenes include SiLK semiconductor dielectric, poly(arylene ethers) (e.g., PAE™ resins from Air Products) as described in EP 0 755 957 B1, Jun. 5, 1999 and/or the Flare™ resins made by Allied Signal Corp. (see N. H. Hendricks and K. S. Y Liu, *Polym. Prepr.* (Am. Chem. Soc., Div. Polym. Chem.) 1996, 37(1), p. 150-1; also, J. S. Drage, et al., *Material Res. Soc., Symp. Proc.* (1997), Volume 476, (Low Dielectric Constant Materials III), pp. 121-128 and those described in U.S. Pat. Nos. 5,115,082; 5,155,175; 5,179,188 and 5,874,516 and in PCT WO91/09081; WO97/01593 and EP 0755957-81). Alternatively, the first layer may be formed with the cross-linked polyphenylenes, as disclosed in WO97/10193.

Most preferably, however, the polyarylene is one of those disclosed in U.S. Pat. No. 5,965,679, incorporated herein by reference. Preferred polyarylenes are the reaction product of a cyclopentadienone functional and acetylene functional compound. The polymers are preferably the cured or cross-linked product of oligomers of the general formula:

wherein A has the structure:

and B has the structure:

wherein EG are end groups having one or more of the structures:

-continued wherein $R^1$ and $R^2$ are independently H or an unsubstituted or inertly-substituted aromatic moiety and $Ar^1$, $Ar^2$ and $Ar^3$ are independently an unsubstituted aromatic moiety or inertly-substituted aromatic moiety, M is a bond, and y is an integer of three or more, p is the number of unreacted acetylene groups in the given mer unit, r is one less than the number of reacted acetylene groups in the given mer unit and p+r=y−1, z is an integer from 1 to about 1000; w is an integer from 0 to about 1000 and v is an integer of two or more.

Such oligomers and polymers can be prepared by reacting a biscyclopentadienone, an aromatic acetylene containing three or more acetylene moieties and, optionally, a polyfunctional compound containing two aromatic acetylene moieties. Such a reaction may be represented by the reaction of compounds of the formulas

(a) a biscyclopentadienone of the formula:

(b) a polyfunctional acetylene of the formula:

(c) and, optionally, a diacetylene of the formula:

wherein $R^1$, $R^2$, $Ar^1$, $Ar^2$, $Ar^3$ and y are as previously defined.

The definition of aromatic moiety includes phenyl, polyaromatic and fused aromatic moieties. "Inertly-substituted" means the substituent groups are essentially inert to the cyclopentadienone and acetylene polymerization reactions and do not readily react under the conditions of use of the cured polymer in microelectronic devices with environmental species, such as water. Such substituent groups include, for example, F, Cl, Br, —$CF_3$, —$OCH_3$, —$OCF_3$, —O—Ph and alkyl of from one to eight carbon atoms, cycloalkyl of from three to about eight carbon atoms. For example, the moieties which can be unsubstituted or inertly-substituted aromatic moieties include:

-continued wherein Z can be: —O—, —S—, alkylene, —CF$_2$—, —CH$_2$—, —O—CF$_2$—, perfluoroalkyl, perfluoroalkoxy, wherein each R$^3$ is independently —H, —CH$_3$, —CH$_2$CH$_3$, —(CH$_2$)$_2$CH$_3$ or Ph. Ph is phenyl.

A second preferred class of organic polymers are the reaction products of compounds of the formula:

wherein each Ar is an aromatic group or inertly-substituted aromatic group and each Ar comprises at least one aromatic ring; each R is independently hydrogen, an alkyl, aryl or inertly-substituted alkyl or aryl group; L is a covalent bond or a group which links one Ar to at least one other Ar; n and m are integers of at least 2; and q is an integer of at least 1, and wherein at least two of the ethynylic groups on at least one of the aromatic rings are ortho to one another. Preferably these polymers have the formula:

The organosilicate resin may be the hydrolyzed or partially hydrolyzed reaction products of substituted alkoxysilanes or substituted acyloxysilanes (see, e.g., U.S. Pat. No. 5,994,489 and WO00/11096, incorporated herein by reference) or may be the cured products of such silanes. Preferably, the hydrolyzed reaction products are applied and then cured during the fabrication process.

Hydrolysis of alkoxy or acyloxysilanes produces a mixture of nonhydrolyzed, partially hydrolyzed, fully hydrolyzed and oligomerized alkoxy silanes or acyloxysilanes. Oligomerization occurs when a hydrolyzed or partially hydrolyzed alkoxysilane or acyloxysilane reacts with another alkoxysilane or acyloxysilane to produce water, alcohol or acid and a Si—O—Si bond. As used herein, the term "hydrolyzed alkoxysilane" or "hydrolyzed acyloxysilane" encompasses any level of hydrolysis, partial or full, as well as oligomerized. The substituted alkoxy or acyloxy silane prior to hydrolysis is preferably of the formula:

wherein R is C$_1$-C$_6$ alkylidene, C$_1$-C$_6$ alkylene, arylene, or a direct bond; Y is C$_1$-C$_6$ alkyl, C$_2$-C$_6$ alkenyl, a C$_{2-6}$ alkynyl, a C$_6$-C$_{20}$ aryl, 3-methacryloxy, 3-acryloxy, 3-aminoethyl-amino, 3-amino, —SiZ$_2$OR', or —OR'; R' is independently, in each occurrence, a C$_1$-C$_6$ alkyl or C$_2$-C$_6$ acyl; and Z is C$_1$-C$_6$ alkyl, C$_2$-C$_6$ alkenyl, C$_{2-6}$ alkynyl, C$_{6-20}$ aryl, or —OR'. The term "alkylidene" refers to aliphatic hydrocarbon radicals wherein attachment occurs on the same carbon. The term "alkylene" refers to radicals, which correspond to the formula —(C$_n$H$_{2n}$)—. The term "aryl" refers to an aromatic radical, "aromatic" being defined as containing (4n+2) electrons, as described in Morrison and Boyd, *Organic Chemistry*, 3rd Ed., 1973. The term "arylene" refers to an aryl radical having two points of attachment. The term "alkyl" refers to saturated aliphatic groups, such as methyl, ethyl, etc. "Alkenyl" refers to alkyl groups containing at least one double bond, such as ethylene, butylene, etc. "Alkynyl" refers to alkyl groups containing at least one carbon to carbon triple bond. "Acyl" refers to a group having —C(O)R structure (e.g., a C$_2$ acyl would be —C(O)CH$_3$). "Acyloxy" refers to groups having —OC(O)R structure. The groups previously described may also contain other substituents, such as halogens, alkyl groups, aryl groups, and hetero groups, such as ethers, oximino, esters, amides; or acidic or basic moieties, i.e., carboxylic, epoxy, amino, sulfonic, or mercapto, provided the alkoxysilane remains compatible with the other components of the coating composition. Preferably, the silanes used are mixtures of silanes. The silanes may be alkoxy silane, acyloxy silane, trialkoxy-silanes, triacetoxysilanes, dialkoxysilanes, diacetoxysilanes, tetraalkyoxysilane or tetra-acetoxysilanes. Examples of some of the organic groups directly attached to the silicon atom may be such things as phenyl, methyl, ethyl, ethacryloxypropyl, aminopropyl, 3-aminoethylaminopropyl, vinyl, benzyl, bicycloheptenyl, cyclohexenylethyl, cyclohexyl, cyclopentadienylpropyl, 7-octa-1-enyl, phenethyl, allyl or acetoxy. The silanes are preferably hydrolyzed or partially hydrolyzed by a solventless process The silanes will retain organic portions even after cure provided some organic groups are bonded directly to the silicon atom. In order to balance desired properties in the hardmask or etchstop layer, a mixture of silanes may be used. For example, applicants have found that use of an aryl alkoxy or aryl acyloxy silane (such as, phenyltrimethoxy silane) in combination with an alkyloxysilane or acyloxysilane having a group with unsaturated carbon-carbon bonds (e.g. alkenyl or alkyidenyl moieties such as vinyl or phenyethynyl) provides excellent wetting, coating and adhesion properties with the preferred organic polymeric dielectric materials, particularly those aromatic polymers which have additional carbon-carbon bond unsaturation. The presence of the aromatic substituted silane also improves moisture sensitivity and may improve dielectric constant over single silane systems. Furthermore, using alkylalkoxy silanes or alkyl acyloxy silanes (such as methyltrimethoxysilane or ethyltrimethoxysilane) in combination with the aryl and unsaturated substituted silanes has been found to further improve moisture retention/exclusion and reduce dielectric constant in the resulting film. Furthermore, a mixture of monoalkoxy, monoacyloxy, dialkoxy, diacyloxy, trialkoxy, triacyloxy, tetraalkoxy silanes or tetraacyloxy silanes may be used in the mixtures as well to enable enhancement of etch selectivity, adjustment of branching, etc.

The hydrolyzed reaction products of such mixtures of silanes are one embodiment of this invention. Particularly, preferred is the following composition which is the hydrolzyed or partially hydrolyzed product of a mixture comprising (a) 50-95 mole % silanes of the formula wherein Ra is $C_1$-$C_6$ alkylidene, $C_1$-$C_6$ alkylene, arylene, or a direct bond; Ya is $C_1$-$C_6$ alkyl, $C_2$-$C_6$ alkenyl, $C_{2-6}$ alkynyl, $C_6$-$C_{20}$ aryl, 3-methacryloxy, 3-acryloxy, 3-aminoethyl-amino, 3-amino, —SiZa$_2$ORa', or —ORa'; Ra' is independently, in each occurrence, a $C_1$-$C_6$ alkyl or $C_2$-$C_6$ acyl; and Za is $C_1$-$C_6$ alkyl, $C_2$-$C_6$ alkenyl, $C_{2-6}$ alkynyl, $C_{6-20}$ aryl, or —ORa', provided at least one of Za or the combination Ra-Ya comprises a non-aromatic carbon carbon bond unsaturation, (b) 5 to 40 mole percent wherein Rb is $C_1$-$C_6$ alkylidene, $C_1$-$C_6$ alkylene, arylene, or a direct bond; Yb is $C_1$-$C_6$ alkyl, $C_2$-$C_6$ alkenyl, $C_{2-6}$ alkynyl, $C_6$-$C_{20}$ aryl, 3-methacryloxy, 3-acryloxy, 3-aminoethyl-amino, 3-amino, —SiZb$_2$ORb', or —ORb'; Rb' is independently, in each occurrence, a $C_1$-$C_6$ alkyl or $C_2$-$C_6$ acyl; and Zb is $C_1$-$C_6$ alkyl, $C_2$-$C_6$ alkenyl, $C_{2-6}$ alkynyl, $C_{6-20}$ aryl, or —ORb', provided at least one of Zb or the combination Rb—Yb comprises an aromatic ring, and.

(c) 0 to 45 mole percent wherein Rc is $C_1$-$C_6$ alkylidene, $C_1$-$C_6$ alkylene, arylene, or a direct bond; Yc is $C_1$-$C_6$ alkyl, $C_2$-$C_6$ alkenyl, $C_{2-6}$ alkynyl, $C_6$-$C_{20}$ aryl, 3-methacryloxy, 3-acryloxy, 3-aminoethyl-amino, 3-amino, —SiZc$_2$ORc', or –ORc'; Rc'is independently, in each occurrence, a $C_1$-$C_6$ alkyl or $C_2$-$C_6$ acyl; and Zc is $C_1$-$C_6$ alkyl, $C_2$-$C_6$ alkenyl, $C_{2-6}$ alkynyl, $C_{6-20}$ aryl, or —ORc', provided at least one of Zc or the combination Rc-Yc comprises an alkyl. The mole percent is based on total moles of silanes (a), (b) and (c) present.

These organosilanes based on mixtures may be useful as hardmasks, etchstops or adhesion promoters in fabrication of microelectronic devices particularly with the preferred organic dielectric polymer layers that may have carbon carbon unsaturation.

The manufacture of the hydrolyzed organosilane composition can be adjusted to give the properties desired, such as control of molecular weight, polymer architecture (e.g. block copolymers, random copolymers, etc.) When combinations of organosilanes are used and one of the organosilanes is significantly more reactive than the other, the Inventors have found that it is preferable to continuously add the more reactive species during the hydrolysis reaction. This ensures that the residuals of both types of silanes are more uniformly distributed throughout the resulting oligomer or polymer. The rate of addition is adjusted to provide the desired mixture of residuals of the silanes in the resulting polymer. As used herein, "continuously add" means that the charge of the reactive silane is not added all at once put is rather added in several uniform portions or, more preferably is poured or added gradually at a desired addition rate. In addition, adding the water continuously during the hydrloysis reaction also facilitates control of molecular weight. The amount of water added in the hydrolysis may also be important. If too little water is used, gellation may occur. If too much water is used, phase separation may occur. For the preferred compositions, 1-3 moles of water per mole of silane, more preferably 1.5-2.5 moles of water per mole of silane may be added.

Other suitable organosilicate resins are resins based on benzocyclobutene chemistry. The preferred organosiloxane is made from monomers of the formula:

wherein each $R^3$ is independently an alkyl group of 1-6 carbon atoms, trimethylsilyl, methoxy or chloro; preferably $R^3$ is hydrogen;

each $R^4$ is independently a divalent, ethylenically unsaturated organic group, preferably an alkenyl of 1 to 6 carbons, most preferably —$CH_2$=$CH_2$—;

each $R^5$ is independently hydrogen, an alkyl group of 1 to 6 carbon atoms, cycloalkyl, aralkyl or phenyl; preferably $R^5$ is methyl;

each $R^6$ is independently hydrogen, alkyl of 1 to 6 carbon atoms, chloro or cyano, preferably hydrogen;

n is an integer of 1 or more;

and each q is an integer of 0 to 3.

The preferred organosiloxane bridged bisbenzocyclobutene monomers can be prepared by methods disclosed, for example, in U.S. Pat. Nos. 4,812,588; 5,136,069; 5,138,081 and WO94/25903.

Suitable oligomeric benzocyclobutene based siloxanes are available from The Dow Chemical Company under the tradename CYCLOTENE™. These materials have the benefit of themselves having a low dielectric constant of about 2.65 and, thus, could be left in the microelectronic device as embedded hardmasks without significant deleterious effect to the performance of the device. The hydrolyzed silanes previously mentioned also have a dielectric constant lower than 4, which is the value of the dielectric constant for silicon oxide which, currently, is commonly used. Silicon nitride is also commonly used and has a dielectric constant of about 7. The silanes also are highly thermally stable and, thus, can withstand rigorous fabrication processing conditions.

The substrate is preferably an electrically active substrate that includes, preferably, a semiconducting material, such as a silicon wafer, silicon-on-insulator, or gallium/arsenide. Preferably, the substrate includes transistors. The substrate may include earlier applied layers of metal interconnects and/or electrically insulating materials. These electrically insulating materials may be organic polymers as discussed above or could be other known dielectrics, such as silicon oxides, fluorinated silicon oxides, silicon nitrides, silsesquioxanes, etc. The earlier applied metal interconnects may have raised features, in which case the organic polymer or its precursor must be capable of filling the gaps between these features.

The organic polymeric dielectric is applied to the substrate by any known method that can achieve the desired thickness. Preferably, an uncured polymer or oligomer of the organic polymer is spin coated from a solvent system at spin speeds of 500 to 5000 rpm. The thickness of the organic polymer layer is preferably less than 5000 nm, more preferably about 50 to about 2000 nm. Suitable solvents include mesitylene, pyridine, triethylamine, N-methylpyrrolidinone (NMP), methyl benzoate, ethyl benzoate, butyl benzoate, cyclopentanone, cyclohexanone, cycloheptanone, cyclooctanone, cyclohexylpyrrolidinone, and ethers or hydroxy ethers, such as dibenzylethers, diglyme, triglyme, diethylene glycol ethyl ether, diethylene glycol methyl ether, dipropylene glycol methyl ether, dipropylene glycol dimethyl ether, propylene glycol phenyl ether, propylene glycol methyl ether, tripropylene glycol methyl ether, toluene, xylene, benzene, dipropylene glycol monomethyl ether acetate, dichlorobenzene, propylene carbonate, naphthalene, diphenyl ether, butyrolactone, dimethylacetamide, dimethylformamide and mixtures thereof.

The remaining liquid is then removed from the coating and the oligomer, or uncured polymer, is preferably cured by heating. Preferably, an initial heating step occurs on a hot plate under nitrogen at atmosphere, followed by a second high temperature cure on a hotplate or in a furnace. Cure temperatures for the preferred polyarylenes, disclosed in U.S. Pat. No. 5,965,679, are in the range of 50° C. to 600° C., more preferably 100 to 450° C., for 0.1 to 60 minutes. In making porous first layers, special steps may need to be provided to burn out or otherwise remove a porogen. See, e.g., WO00/31183, incorporated herein by reference.

After applying (the application step may include a bake step to remove residual solvent) and, optionally, curing the first layer, the organosilicate material is applied. Any known coating process may be used, such as vapor deposition of monomers, spin coating, dip coating, spray coating, etc. However, spin coating of an oligomer or low molecular weight polymer solution is preferred. The thickness of the organosilicate layer is preferably greater than 50 Angstroms (5 nm), more preferably greater than 100 Angstroms. Preferably, the layer has a thickness of less than about 1000 Angstroms for a top hardmask and less than about 500 Angstroms for an embedded hardmask. According to a first embodiment, the organosilicate material is cured, preferably at temperatures of 50 to 500, more preferably 100 to 400° C. for 0.1 to 60 minutes. The precise temperatures will depend on the organosilicate material selected. A photoresist is applied over the organosilicate material. The photoresist is imaged and developed according to conventional methods to remove a portion of the photoresist exposing a pattern on the hardmask. The organosilicate hardmask may then be etched to expose a portion of the first layer dielectric. Etching of the organosilicate hardmask may occur by variety of methods, such as wet etch (e.g., electrochemical, photoelectrochemical or open circuit etching) or dry etch (e.g., vapor, plasma, laserbeam, e-beam, ion) techniques as described in *Etching in Microsystems*, Michael Kohler, Wiley-VCH. The photoresist may be removed during etching or in a separate removal step. The exposed portion of the first dielectric layer may then be etched by such methods as wet or dry etching to form a trench, via or other desired feature. If desired, a second organic polymer layer may then be applied and cured over the patterned organosilicate layer. A second hardmask of any type, but preferably again an organosilicate, may be applied over the second organic polymer layer and patterned according to standard processes. The organic polymer can then be etched down to the embedded hardmask or etch stop and where a pattern has been opened in the embedded hardmask, down through the first layer of organic polymer.

According to a second embodiment, a curable organosilicate formulation (e.g., b-staged or partially cured oligomer or hydrolyzed or partially hydrolyzed organosilane) includes a photoactive agent such as a photoinitiator that initiates further cure or cross-lining of the curable polymer. Examples of such compounds include peroxides, azo compounds and benzoin derivatives. Photoactive, spin-coatable formulations of BCB based organosilicates are commercially available from The Dow Chemical Company under the trade name CYCLOTENE 4000 series. Alternatively, the system could be a positive system comprising a photoactive compound and a separate dissolution inhibitor or, preferably a dissolution inhibitor, which itself is photoactive. Non-limiting examples of suitable photosensitive, dissolution inhibiting compositions/compounds include sulfonyl esters of trihydroxybenzophenone (for example, THBP) and cumyl phenol. In this case, after applying the organosilicate and removing excess solvent, the organosilicate hardmask is exposed to activating wavelengths of radiation and developed to leave a pattern of hardmask on the organic polymer layer. As a result, the use of a photoactive agent can result in either positive or negative exposure properties. Positive means that the photoinitiator cross-links upon exposure, negative means that the photoinitiator breaks bonds upon exposure. Suitable developers are known in the art and include hydrocarbons, glycols, glycol ethers, substituted aromatic solvents, and mixtures thereof. The hardmask is then cured as in the first embodiment. After curing, the exposed organic polymer layer may be etched as in the first embodiment.

According to a third embodiment, after being applied over a first organic polymer dielectric layer, the organosilicate material is cured, preferably at temperatures of 50 to 500° C., more preferably 100 to 400° C. for 0.1 to 60 minutes. The precise temperatures will depend on the organosilicate material selected. A second layer of the organic polymer dielectric can then be applied by any of the coating methods previously mentioned and a full or partial cure of the organic polymer layer completed. A variety of dual damascene processes can be used to construct both trench and via structures using the embedded organosilicate layer as an etch stop to control the uniformity, depth, and/or shape of the trenches. The organosilicate hardmask may then be etched to expose a portion of the first layer dielectric. Etching of the organosilicate hardmask may occur by variety of methods, such as wet etch (e.g., electrochemical, photoelectrochemical or open circuit etching) or dry etch (e.g., vapor, plasma, laserbeam, e-beam, ion) etch techniques as described in *Etching in Microsystems*, Michael Kohler, Wiley-VCH. The exposed portion of the first dielectric layer may then be etched by such methods as wet or dry etching to create a via or other desired feature.

Examples of some dual damascene processes that may be used include the following:

Scheme 1: a non-sacrificial hardmask is used as an embedded hardmask and a single top hardmask is used, via patterning at via level. In this scheme, the via level dielectric is deposited followed by application of the embedded hardmask layer and subsequent application and patterning of a photoresist. A copper diffusion barrier may be applied under the dieletric layer, in which case the diffusion barrier will also have to be etched at an appropriate point in the process to enable formation of the connection to the metal vias. The integration can continue by one of the following options: Option 1: Etch of hardmask only; Option 2: Full etch of hardmask and partial etch of dielectric; Option 3: Full etch of hardmask and dielectrics; Option 4: full etch of hardmask, dielectric and diffusion barrier. The photoresist is removed and the trench level dielectric is applied followed by a top hardmask and application and patterning of a photoresist. The structure is then etched down to substrate level where a via channel has been made or down to the embedded hardmask where that hardmask was not previously patterned.

Scheme 2: In scheme 2 the following layers are applied to the substrate in order: diffusion barrier, via level dielectric, embedded hardmask, trench level dielectric, trench hardmask and patterned photoresist. The trench hard mask is then etched to desired trench profile. Via patterned photoresist is then applied and via etch occurs according to one of the following options: Option 1: via profile etched only through trench dielectric to top of embedded hardmask, followed by etch of the embedded hardmask, followed by etch of trench and via; Option 2: via profile etched through the trench dielectric and embedded hardmask followed by etch of trench and via; Option 3: via profile etched all the way to substrate followed by etch of remaining trench profile.

Scheme 3: In this scheme the following layers are applied to the substrate in order: diffusion barrier, via level dielectric, embedded hardmask, trench level dielectric, trench hardmask and patterned photoresist. The trench hard mask is then etched to desired via profile. The next etch step can continue to form the via profile down to any layer desired in the stack. The top hardmask is then etched for trench profile and the remaining etch of the trench and via are performed.

Scheme 4 resembles scheme 2 except a dual top hardmask is used.

Scheme 5 resembles scheme 3 except a dual top hardmask is used.

Schemes 6-8 resemble schemes 1-3, respectively, but are enabled by the use of a photodefinable, embedded hardmask such as is taught in this patent document. As such no photoresist is required to image the embedded hardmask.

Schemes 9 and 10 resemble schemes 4 and 5 but all hardmasks are photodefinable.

Scheme 11 does not use an embedded hardmask but rather uses dual top hardmask and time etch to form via and trench. Either the trench or the via profile may be formed first.

Scheme 12 is similar to scheme 11 but uses a photodefinable hardmask for at least one of the dual top hardmask layers.

Schemes 13-24 are the same as schemes 1-12, but the-top hardmasks are removed rather than remaining in the stack.

In schemes 1-24 the metallization occurs after via and trench formation and may include use of barrier materials as is known in the art.

In using schemes 1-24 with this invention, at least one of the hardmask layers is an organosilicate as defined herein and one of the dielectric layers is an organic polymer. Variations on these procedures for use of the organosilicate hardmask with organic polymeric dielectrics are considered within the scope of this invention. For example, after etching a pattern in the organic polymeric dielectric, metal interconnects may be added by known processes. For example, with copper interconnects a liner material, such as a tantalum, titanium, tantalum based alloys, titanium based alloys, and tungsten based alloys may be applied by physical vapor, thermal, chemical or plasma assisted vapor deposition. A copper seed layer may also be applied by physical, thermal, plasma assisted vapor, electroless or electroplated deposition followed by electroplating of copper metal. If the interconnect system is subsequently annealed at a sufficiently high temperature (greater than 200° C.), a benzocyclobutene (BCB) based organosilicate hardmask will begin to degrade and may be easily cleaned off with a weak acid, for example. Alternatively, a tungsten plug could be formed in a via by known methods.

Chemical mechanical polishing to enhance planarization and/or remove surface layers or features may also be used according to known methods. Cleaning steps to remove photoresists and other residual layers may also be used as is known.

Note that since the organosilicate hardmask itself has a low dielectric constant it may be convenient to use it as an embedded hardmask, which is not removed from the article, but rather has additional interconnect/dielectric layers applied over it. Alternatively, the organosilicate hardmask may be removed by any known process, e.g. oxygen/solvent treatment, thermal degradation plus solvent cleaning, etc.

One important factor that enables the organosilicate resin to be used as a hardmask for the organic polymer dielectrics is that organosilicate resins are relatively resistant to the chemistries used to etch the organic polymer dielectrics. Etch selectivity can be defined as the thickness of the organic polymer dielectric divided by the thickness of organosilicate removed when exposed to the same etch chemistry. According to this invention, preferably an etch selectivity of at least 3, more preferably at least 5, is present. For the hydrolyzed silanes, etch selectivity may be higher—on the order of greater than 10, preferably greater than 20. Etch selectivities can be increased by performing treatments, such as exposure to fluorinated plasmas, and irradiation with light or e-beams on the BCB based organosilicates.

Some of the benefits of the present invention become clearer when examined in the form of some specific examples.

One approach uses a non-sacrificial (i.e., the layer is not removed but rather becomes a permanent part of the device), non-photodefinable organosilicate. This allows for the replacement of a vapor phase deposited hardmask with a low permittivity spin-on deposited hardmask. Standard patterning practices still apply. An improvement in performance in the device is obtained due to a decrease in the combined dielectric constant of the multilayered dielectric stack. The relative permittivity of the spin on hardmask of this invention is between 3.2, preferably 3.0, and 1.8 and compared to standard vapor phase hardmasks having a relative permittivity between 9 and 3.0. Secondly, a cost reduction is obtained due to the lower cost-of-ownership intrinsic to spin-on dielectrics.

A second approach uses a sacrificial (i.e., the layer is removed), non-photodefinable organosilicate resin. Standard patterning practices still apply. After the patterning step, a dedicated processing step involving, for example, an oxygen and solvent treatment is used to remove the sacrificial spin-on hardmask. Due to the removal of this layer, the lowest possible dielectric constant is obtained. An increase in yield and reliability is obtained due to a decrease in number of interfaces in the multilevel build.

A third approach uses a non-sacrificial, photodefinable organosilicate. In addition to the benefits noted in the first approach, an increase in yield is anticipated due to the lowered probability of processing induced defects. Also, the need for photoresists and softmasks is reduced or eliminated.

A fourth approach uses a sacrificial, photodefinable organosilicate. The benefits noted in the second approach still apply with the added benefits of an increase in yield due to the lowered probability of processing-induced defects and simplification of the processing due to elimination of the need for the photoresists or softmasks.

Additional variations on the method of this invention are exemplified by the following procedures.

Figure 1:
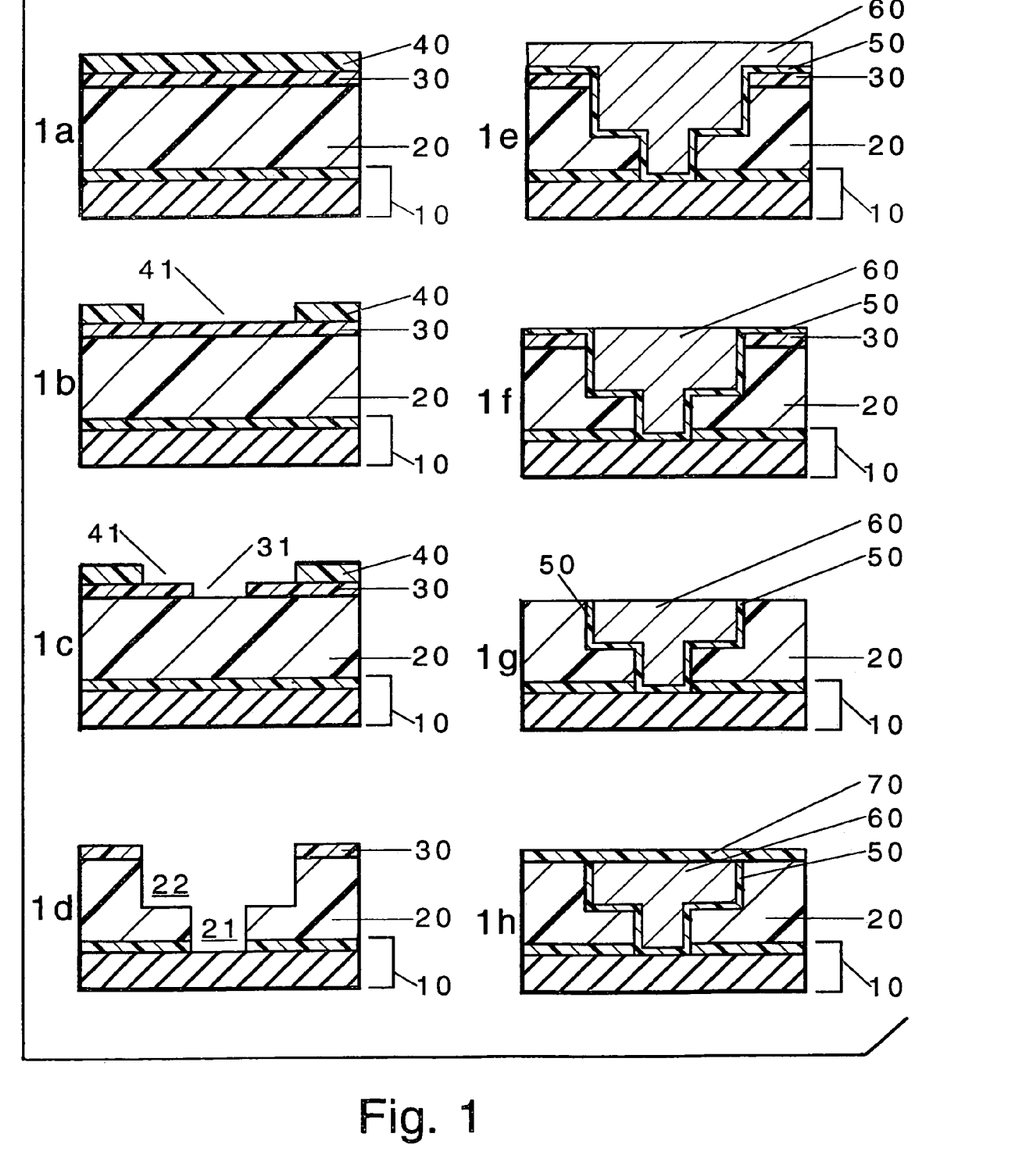
FIG. 1 and FIG. 2 are cross section representations showing exemplary integration schemes using the hard mask materials of this invention.

Referring to FIG. 1, on a substrate 10, is coated polyarylene 20, e.g., SiLK™ I semiconductor dielectric, which is then cured. Onto the cured polyarylene 20 is coated an organosilicate 30, which is also then cured. Onto the organosilicate 30, an inorganic hardmask 40 may be vapor deposited. A photoresist is coated onto inorganic hardmask 40 and imaged and developed and the hardmask 40 is then etched and the remaining photoresist removed by cleaning to reveal a pattern 41 of a trench in the inorganic hardmask 40. A second photoresist layer is applied, exposed and developed and the organosilicate 30 is etched. The remaining photoresist is again removed to reveal a pattern 31 of a via in the organosilicate 30. Referring to FIG. 1d, a via 21 is etched in the organic polymer, followed by a change of etch chemistry to a chemistry that will etch through the organosilicate and use of a timed etch to form the trench 22. Hardmask 40 may be removed at this time by conventional removal methods. Post etch cleans may be used before depositing a liner 50, copper seed and electroplating copper 60 onto the substrate. The copper 60 may be chemically mechanically polished to planarize as shown in 1f. The copper may then be annealed at high temperature and the organosilicate resin easily removed by a weak acid clean. If desired, a cap layer 70 may be deposited and the steps repeated to provide additional layers.

Figure 2:
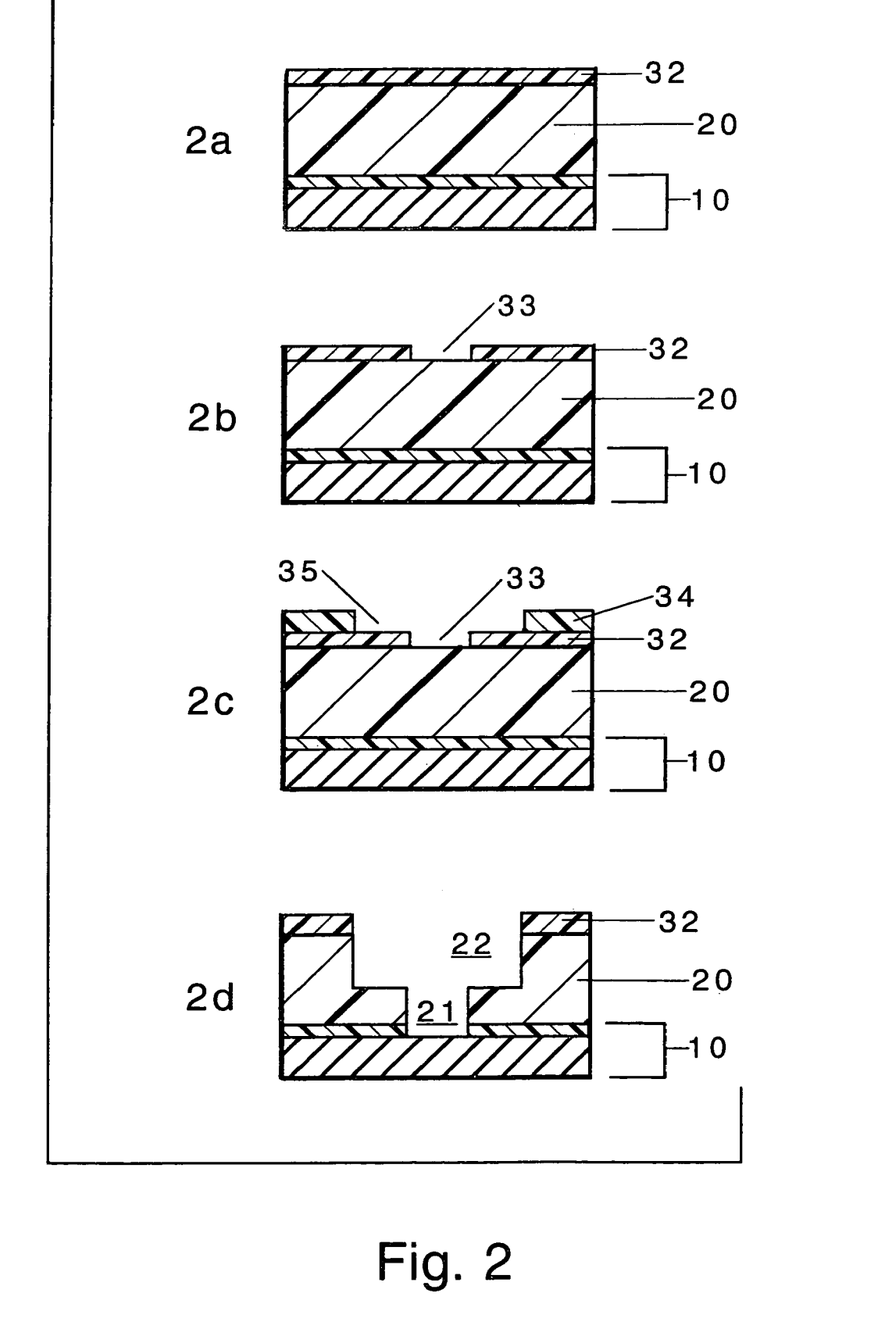

Referring to FIG. 2, on a substrate 10, is coated polyarylene 20, which is then cured. A photoactive organosilicate 32, e.g., CYCLOTENE 4022 photodefinable BCB based resin, is applied and solvent is removed. The photoactive organosilicate is imagewise exposed to activating wavelengths of radiation and the unexposed portions are removed to form a via pattern 33. The remaining organosilicate 32 is then cured. A second photoactive organosilicate 34 is applied, exposed and developed to form a trench pattern 35, followed by cure of the organosilicate 34. A non-fluorine gas can be used to etch the via 21 followed by a fluorinated gas etch to remove the organosilicate hardmask 34 and form the trench 22. The metalization steps may then be formed as recited in connection with FIG. 1.

As mentioned previously, the process of the present invention can be used in dual damascene fabrication. For example, the substrate is a subtractive or damascene interconnect structure. A vapor deposited inorganic film ($Si_xO_y$, $Si_xO_yN_z$, $Si_xN_y$, $Si_xC_y$, $Si_xO_yC_z$) is applied, followed by application of the organic polymer (e.g., SiLK resin) film, which is baked and cured. An optional embedded etch stop layer can be applied (e.g., a vapor phase deposited layer or more preferably an organosilicate film as recited in this patent document, which can optionally be photo-definable). The embedded mask can be patterned using conventional techniques. Next, a second organic polymer film is applied, which is baked and cured. On top of the second organic polymer film, a dual hardmask strategy may implemented, wherein one of the films is an organosilicate film and the other is an inorganic $Si_xO_y$, $Si_xO_yN_z$, $Si_xN_y$, $Si_xC_y$, $Si_xO_yC_z$, or metallic (e.g., Ta, TaN, Ti, TiN, TiSiN, TaSiN, WN, WSiN) film. The four approaches of photodefinable, non-photo definable, sacrificial, and non-sacrificial organosilicate layers apply here, as well.

The sequence used to transfer the resist patterns or exposed and developed organosilicate patterns for via and trench into the organic polymer film can be done according to the via first and trench level, full or partial etch of via first at trench level, trench first at trench level, full or partial etch of trench at trench level, or via first or full or partial etch of via at via level, depending on the use of an embedded hardmask. Once the pattern is transferred into the SiLK film, conventional methods for metallization apply.

This invention applies to subtractive fabrication methods as well as damascene methods. For subtractive methods, the substrate consists of patterned metal features manufactured by conventional technology. In a gap-filling version, the organic polymer resin (e.g., SiLK H semiconductor dielectric) is required and is deposited by any applicable technique and undergoes a bake and cure step resulting in the evaporation of the solvents and densification of the organic polymer film. The organic polymer film can optionally be mechanically chemically polished or etched (using resist etch back, polymer etch back or any other related methodology) to obtain a globally planarized film. This last step can be postponed. On the organic polymer film, the organosilicate (OS) film can be deposited by the methods described above. Again, the organosilicate can be sacrificial or non-sacrificial, and photodefinable or non-photodefinable as is described more fully below:

Option a: The organosilicate film is non sacrificial and not photo-definable. A resist pattern is applied on the OS film and this pattern is transferred into the OS film by dry etching techniques. Subsequently, the organic polymer film is patterned by conventional means as described earlier using the patterned film as a template.

Option b: The organosilicate film is sacrificial and not photo-definable. A resist pattern is applied on the OS film and this pattern is transferred into the OS film by dry etching techniques. Subsequently, the organic polymer film is patterned by conventional means, as described earlier, using the patterned OS film as template. After the organic polymer film has been patterned, the OS film is removed by dissolving in an acid or by dry etching or by chemical mechanical polishing Option c: The organosilicate film is non sacrificial and photo-definable. The OS film is exposed and developed, as described earlier, and this pattern is transferred into the OS film by dry etching techniques. Subsequently, the organic polymer film is patterned by conventional means, as described earlier, using the patterned film as template.

Option d: The organosilicate film is sacrificial and photo-definable. The OS film is exposed and developed, as described earlier, and this pattern is transferred into the OS film by dry etching techniques. Subsequently, the organic polymer film is patterned by conventional means, as described earlier, using the patterned OS film as a template. After the organic polymer film has been patterned, the OS film is removed by dissolving in an acid or by dry etching or by chemical mechanical polishing If the global planarizing step has been omitted previously, this step can now be introduced into the flow. This step is recommended but not essential in the process sequence. Once the pattern has been transferred into the organic polymer film, conventional plug filling techniques can be applied to make the interconnect.

EXAMPLES

Example 1

Fabrication of Single Level Damascene Structures

SiLK-I semiconductor resin was spin coated onto a 200 mm Silicon substrate to form a layer approximately one micron thick. The coating was cured on a hotplate at 325° C. for 1.5 minutes and in a furnace at 400° C. for 30 minutes. Next, CYCLOTENE 4022-35 photodefinable BCB based resin was spin coated onto the SiLK-I resin layer. The BCB formed a uniform, good quality coating on the SiLK-I coating with no wetting defects. The BCB layer was then exposed to a UV source to pattern it, developed and cured using the recommended photodefinition steps for CYCLOTENE 4022-35 BCB based resin.

The defined pattern was then etched into the SiLK-I coating using a nitrogen/oxygen-based plasma. After etching, the BCB hardmask remained present on the SiLK-I coating demonstrating fairly good etch selectivity. Next, the wafer was metallized using plasma vapor deposition. First, a thin layer (200 A) of titanium was sputter deposited followed by sputter deposition of a thick copper film. At this point, the wafer was annealed for 1 hour at 400° C. to mimic a typical copper anneal. Lastly, the copper remaining on the surface of the BCB hardmask and the BCB hardmask were removed using a mild buffing cloth (cotton) and with mesitylene solvent. The result was removal of the top BCB/Ti/Copper layers but leaving the copper in the defined features.

Example 2

CYCLOTENE 7200 resin formulation was diluted to different solids levels with mesitylene. These were then spin-coated onto cured 7000 Angstrom (7000 A) thick SiLK-I resin films. The BCB was then photodefined using standard, recommended processes. The parts were then etched using a nitrogen/oxygen plasma. The results, listed in Table 1, show the etch selectivity of 8:1 of this non-optimized etch process.

TABLE I

Etch Selectivity of Cyclotene Resin to SiLK Resin

| % Solids in BCB Solution | Pre-etch Hardmask Thickness, Å | Post-etch Hardmask Thickness, Å | Amount of Hardmask Etched Å | Maximum Etch Selectivity |
|---|---|---|---|---|
| 10 | 928 | 0 | 928 | 7.5:1 |
| 15 | 3025 | 2150 | 875 | 8.0:1 |
| 20 | 8618 | 6550 | 2068 | 3.4:1 |
| 30 | 26680 | 25532 | 1148 | 6.1:1 |

Example 3

Vinyl triacetoxy silane (VTAS) was added to Dowanol PMA at 3.5 percent and 10.0 percent by weight. The VTAS was hydrolyzed by adding 1 mole water to 1 mole VTAS. Next, two bare silicon wafers were spin-coated with the two solutions and baked at 340° C. for one minute under a nitrogen blanket. The thickness of the VTAS layer, after the bake, was about 24.5 nm and 132 nm for the 3.5 percent and 10 percent solutions, respectively.

Separately, additional wafers were prepared by spin coating 100 mm silicon wafers with SiLK-I 550 dielectric resin and curing at 400° C. for 30 minutes. Using profilometry, the thickness of the SiLK layer was about 450 nm. The stock wafers were then covered with a low tack tape, such that only half of the wafer was exposed. Then the VTAS/PMA solution was spin-coated, the low-tack tape was removed, and the wafer was placed on a hot plate at 340° C. for 1 minute under a nitrogen environment. The result was half-coated wafers, one with the 3.5 percent solution and one with the 10 percent solution.

These wafers were then exposed to nitrogen-oxygen plasma for one minute. After the plasma treatment, the half of the wafer without the VTAS overlayer was completely etched. However, the SiLK resin with the VTAS hardmask was not etched at all. As a result, the etch selectivity of the VTAS hardmask to the SiLK resin was greater than 18:1 (450 nm or SiLK resin totally removed/24.5 nm of VTAS not completely removed).

Example 4

Additional wafers were coated with the SiLK-I 550 resin and cured as in Example 3. These wafers were then coated with 10 percent VTAS solution and again baked at 340° C. for 1 minute under nitrogen. Then a second SiLK-I resin layer was spin-coated. The coating was of acceptable quality. The wafer was then cured 5 times at 400° C. for 30 minutes. No blistering, peeling or cracking was observed in the wafer, thereby demonstrating the sufficient thermal stability of this material for the application.

Example 5

An organosilane solution was prepared by adding 3.92 g of vinyltriacetoxysilane (VTAS) and 1.13 g of phenyltrimethoxysilane (PTMS) to 95.15 g of Dowanol™ PMA. An equi-molar mass of water based on total silane content was added to the mixture and the solution was shaken overnight. The solution was filtered through a 0.1 um filter.

Approximately 3 mL of the resulting solution was applied onto a 200 mm silicon wafer at 750 rpm. Immediately after dispensing the solution, the wafer was accelerated at 10000 rpm/sec to 3000 rpm and dried for 30 seconds. After drying, the wafer was baked on a hot plate at 180° C. for 60 seconds. The thickness of the silane film was 152 A.

Approximately 3 mL of a SiLK™ I Semiconductor Dielectric solution (150 nm nominal film thickness) was applied at 60 rpm to the silane coated wafer prepared above. Immediately after dispensing the oligomer solution, the wafer was accelerated at 10000 rpm/sec to 3000 rpm and dried for 45 seconds. After drying, the oligomer was further polymerized on a hot plate at 320° C. for 90 seconds under a nitrogen blanket. After hot plate baking, the wafer was visually evaluated for defects. Minimal defects were observed. The thickness of the SiLK dielectric film was approximately 1400 Angstroms (1400 A). The adhesion of the silane/SiLK stack on the silicon wafer was measured to be 0.27 MPa-m$^{1/2}$.

Subsequent testing, including etch selectivity, on wafers prepared in manner similar to the preparation method stated above and in Example 6 revealed that the underlying organosilicate film may have been damaged or partially removed during application of the subsequent overlying dielectric layer. Various methods for avoiding such a problem may include solvent selection for the spin formulation for the overlying dielectric layer, selection of silane monomers to increase cross-linking or uniformity of the organosilicate layer, method of manufacture of the organosilicate material to increase uniformity of the layer (see e.g. Example 10).

Example 6

An organosilane solution was prepared by adding 4.9 g of 0.001 N HCl to 15.3 g of Dowanol PMA. The PMA mixture was placed in an ice bath and 1.7 g of PTMS was added while stirring. 18.3 g of VTAS was than slowly added to the solution. The silane solution was shaken for 60 minutes and then diluted to 14.8 wt % organosilane by adding 39.47 g of the solution to 93.30 g of Dowanol PMA. The solution was shaken for 5 minutes and then allowed to equilibrate. The solution was then further diluted to 10 wt % organosilane by adding 16.90 g of the 14.8% stock solution to 33.11 g of Dowanol PMA.

Approximately 3 mL of the silane solution prepared above was applied onto an 200 mm silicon wafer surface at 750 rpm. Immediately after dispensing the solution the wafer was accelerated at 10000 rpm/sec to 3000 rpm and dried for 30 seconds. After drying, the wafer was baked on a hot plate at 180° C. for 60 seconds. The thickness of the silane film was 310 Angstroms (310 A).

Approximately 3 mL of a SiLK I Semiconductor Dielectric solution (100 nm nominal film thickness) was applied to the silane coated wafer prepared above at 60 rpm. Immediately after dispensing the oligomer solution the wafer was accelerated at 10000 rpm/sec to 3000 rpm and dried for 45 seconds. After drying, the oligomer was further polymerized on a hot plate at 320° C. for 90 seconds under a nitrogen blanket. After hot plate baking, the wafer was visually evaluated for defects. Minimal defects were observed. The thickness of the SiLK dielectric film was approximately 1080 Angstroms (1080 A).

Example 7

An organosilane solution was prepared as in Example 5 except that no PTMS was added to the solution. Only VTAS was used as the silane component. The nominal organosilane concentration (100% VTAS) was 4.5 wt %.

Approximately 3 mL of the silane solution prepared above was applied onto a 200 mm silicon wafer surface at 750 rpm. Immediately after dispensing the solution the wafer was accelerated at 10000 rpm/sec to 3000 rpm and dried for 30 seconds. After drying, the wafer was baked on a hot plate at 180° C. for 60 seconds. The thickness of the silane film was 240 Angstroms (A).

Approximately 3 mL of a SiLK I Semiconductor Dielectric solution (100 nm nominal film thickness) was applied at 60 rpm to the silane coated wafer prepared above. Immediately after dispensing the oligomer solution the wafer was accelerated at 10000 rpm/sec to 3000 rpm and dried for 45 seconds. After drying, the oligomer was further polymerized on a hot plate at 320° C. for 90 seconds under a nitrogen blanket. After hot plate baking, the wafer was visually evaluated for defects. Massive film defects, particularly dewetted areas and film retraction, were observed. The thickness of the SiLK film was approximately 1170 A.

A series of wafers was then prepared as described above except that the SiLK dielectric film thickness varied from 1170 A to 10400 A. A visual scale was used to characterize the SiLK dielectric film quality with 10 representing very poor film quality (massive dewetting and/or retraction) and 1 representing excellent film qualtiy. The table below gives the film quality and SiLK film thicknesses. The wafers described in Examples 5 and 6 are included for comparison. This demonstrates that for thin overcoat films the compatibility of the overcoat with the underlying layer appears more sensitive than for thicker overcoat films.

| Wafer ID | Organosilane Film Thickness, A | SiLK Film Thickness, A | Film Quality |
|---|---|---|---|
| A | 240 | 1170 | 10 |
| B | 240 | 1440 | 10 |
| C | 240 | 2560 | 5 |
| D | 240 | 3760 | 2 |
| E | 240 | 5700 | 2 |
| F | 240 | 10400 | 2 |
| Example 5 | 150 | 1440 | 2 |
| Example 6 | 310 | 1080 | 2 |

Example 8

An organosilane solution was prepared as in Example 7 except that the final organosilane concentration was 2.5 wt %.

A series of wafers were prepared as described in Example 7. The table below summarizes the film quality and thickness of these wafers. The wafers described in Examples 5 and 6 are included for comparison.

| Wafer ID | Organosilane Film Thickness, A | SiLK Film Thickness, A | Film Quality |
| --- | --- | --- | --- |
| A' | 120–140 | 1170 | 10 |
| B' | 120–140 | 1440 | 10 |
| C' | 120–140 | 2560 | 1 |
| D' | 120–140 | 3760 | 1 |
| E' | 120–140 | 5700 | 1 |
| F' | 120–140 | 10400 | 1 |
| Example 5 | 150 | 1440 | 2 |
| Example 6 | 310 | 1080 | 2 |

Example 9

This is an example of making a buried etch stop layer.

Approximately 3 mL of AP4000 Adhesion Promoter from The Dow Chemical Company was applied onto a 200 mm silicon wafer at 750 rpm. Immediately after dispensing the solution, the wafer was accelerated at 10000 rpm/sec to 3000 rpm and dried for 30 seconds. After drying, the wafer was baked on a hot plate at 180° C. for 60 seconds. The thickness of the silane film was 152 A. Approximately 3 mL of a SiLK I Semiconductor Dielectric solution (400 nm nominal film thickness) was then applied at 60 rpm to the adhesion promoter coated wafer prepared above. Immediately after dispensing the oligomer solution the wafer was accelerated at 10000 rpm/sec to 3000 rpm and dried for 45 seconds. After drying, the oligomer was further polymerized on a hot plate at 320° C. for 90 seconds under a nitrogen blanket. The coated wafer was then cured in a vacuum for 30 minutes at 400° C.

Approximately 3 ml of the organosilane solution prepared in Example 6 was then applied onto the cured 200 mm wafer surface at 750 rpm. Immediately after dispensing the solution the wafer was accelerated at 10000 rpm/sec to 3000 rpm and dried for 30 seconds. After drying, the wafer was baked on a hot plate at 180° C. for 60 seconds. Approximately 3 ml of a SiLK I Semiconductor Dielectric solution (100 nm nominal film thickness) was then applied to the wafer at 60 rpm. Immediately after dispensing the oligomer solution the wafer was accelerated at 10000 rpm/sec to 3000 rpm and dried for 45 seconds. After drying, the oligomer was further polymerized on a hot plate at 320° C. for 90 seconds under a nitrogen blanket. After hot plate baking, the wafer was visually evaluated for defects. No visual defects were observed.

Example 10

This example demonstrates the advantages of using a combination of different silanes.

An organosilane mixture was prepared by first adding 0.58 g of 1 N acetic acid to 3.19 g of phenyltrimethoxysilane (PTMS). The PTMS mixture was placed in a water bath. 21.13 g of VTAS and 3.28 g of deionized water were simultaneously, continuously added to the stirred PTMS solution. The silane solution was stirred for 60 minutes and then diluted to 14.1 wt % organosilane by adding 26.24 g of the solution to 133.98 g of Dowanol PMA. This stock solution was shaken for 5 minutes and then allowed to equilibrate. The solution was then further diluted to 4.2 wt % organosilane by adding 11.66 g of the 14.1% stock solution to 29.78 g of Dowanol PMA.

Approximately 3 mL of the diluted silane solution prepared above was applied onto a 200 mm silicon wafer surface at 750 rpm. Immediately after dispensing the solution the wafer was accelerated at 10000 rpm/sec to 3000 rpm and dried for 30 seconds. After drying, the wafer was baked on a hot plate at 250° C. for 60 seconds. The thickness of the silane film was 913 Angstroms.

Approximately 3 mL of a SiLK I Semiconductor Dielectric solution (100 nm nominal film thickness) was applied at 60 rpm to the silane coated wafer prepared above. Immediately after dispensing the oligomer solution the wafer was accelerated at 10000 rpm/sec to 3000 rpm and dried for 45 seconds. After drying, the oligomer was further polymerized on a hot plate at 320° C. for 90 seconds under a nitrogen blanket. After hot plate baking, the wafer was visually evaluated for defects. Minimal defects were observed. The thickness of the SiLK dielectric film was approximately 1080 Angstroms.

What is claimed is:

1. A method of making a composition which composition comprises the hydrolyzed or partially hydrolyzed product of a combination of silanes comprising (a) an alkoxysilane or acyloxy silane having at least one hydrocarbon group attached to the Si atom which hydrocarbon group contains a non-aromatic, unsaturated carbon to carbon bond, and (b) an alkoxysilane or acyloxysilane having at least one hydrocarbon group attached directly to the Si atom which hydrocarbon group includes an aromatic ring, wherein the method comprises a hydrolysis reaction of components (a) and (b) characterized in that the more highly reactive component of components (a) and (b) is continuously added during the hydrolysis reaction to a solution comprising the other component.

2. The method of claim 1 wherein water is also continuously added during the hydrolysis reaction.

3. The method of claim 1 wherein the more highly reactive component is added at a desired addition rate.

4. The method of claim 1 wherein the more highly reactive component is added in uniform portions.

5. The method of claim 2 wherein the more highly reactive component and the water are each added at set addition rates.

6. The method of claim 2 wherein the more highly reactive component and the water are each added in uniform portions.

* * * * *